(12) United States Patent
Ho et al.

(10) Patent No.: US 9,911,877 B2
(45) Date of Patent: Mar. 6, 2018

(54) ELECTRONIC DEVICE, PACKAGE STRUCTURE AND METHOD OF MANUFACTURING THE SAME

(71) Applicant: Advanced Semiconductor Engineering, Inc., Kaohsiung (TW)

(72) Inventors: Hsin-Ying Ho, Kaohsiung (TW); Chia Yun Hsu, Kaohsiung (TW); Tsung-Yu Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/347,664

(22) Filed: Nov. 9, 2016

(65) Prior Publication Data
US 2017/0207352 A1    Jul. 20, 2017

Related U.S. Application Data

(60) Provisional application No. 62/278,661, filed on Jan. 14, 2016.

(51) Int. Cl.
*H01L 31/0232* (2014.01)
*F21V 8/00* (2006.01)
*G01J 1/02* (2006.01)
*G01J 1/04* (2006.01)
*H01L 31/12* (2006.01)
*H01L 31/0203* (2014.01)
*H01L 31/18* (2006.01)

(52) U.S. Cl.
CPC ...... *H01L 31/02327* (2013.01); *G01J 1/0209* (2013.01); *G01J 1/0425* (2013.01); *G02B 6/0028* (2013.01); *H01L 31/0203* (2013.01); *H01L 31/125* (2013.01); *H01L 31/18* (2013.01)

(58) Field of Classification Search
CPC .......... H01L 31/0232; H01L 31/02325; H01L 31/02327; H01L 31/12–31/173; G02B 6/0023; G02B 6/0028
See application file for complete search history.

(56) References Cited

U.S. PATENT DOCUMENTS 7,200,288 B2    4/2007 Ogura
2016/0240575 A1*    8/2016 Huang ................ G02B 6/0001

\* cited by examiner

*Primary Examiner* — Daniel Shook
(74) *Attorney, Agent, or Firm* — Foley & Lardner LLP; Cliff Z. Liu

(57) ABSTRACT

An electronic device includes a light source, a light receiver, a first light guide structure, and a second light guide structure. The first light guide structure faces a light emitting surface of the light source and faces a lateral wall of the light receiver. The second light guide structure is disposed over the light receiver and coupled to the first light guide structure. The light receiver and the second light guide structure defines a cavity between the light receiver and the second light guide structure.

18 Claims, 25 Drawing Sheets

ELECTRONIC DEVICE, PACKAGE STRUCTURE AND METHOD OF MANUFACTURING THE SAME

CROSS-REFERENCE TO RELATED APPLICATION

This application claims priority to and the benefit of U.S. Provisional Application No. 62/278,661, filed Jan. 14, 2016, the content of which is incorporated herein by reference in its entirety.

BACKGROUND

1. Technical Field

The present disclosure relates to an electronic device, a package structure and method of manufacturing the same, and, more particularly, to an electronic device and a package structure configured as an optical sensor with high sensitivity contrast.

2. Description of the Related Art

Optical sensors such as biosensors or fingerprint recognition sensors are widely deployed. However, conventional optical sensors suffer from low sensitivity contrast.

SUMMARY

In one or more embodiments, an electronic device includes a light source, a light receiver, a first light guide structure facing a light emitting surface of the light source and facing a lateral wall of the light receiver, and a second light guide structure over the light receiver and coupled to the first light guide structure. The light receiver and the second light guide structure defines a cavity between the light receiver and the second light guide structure.

In one or more embodiments, a package structure includes a carrier, a light receiver over the carrier, and a light guide structure encapsulating the light receiver. The light guide structure defines a cavity recessed from a top surface of the light guide structure, the cavity is disposed over and aligned with the light receiver, and the light guide structure includes a lateral wall surrounding the cavity.

In one or more embodiments, a method for manufacturing an electronic device includes providing a carrier; disposing a light source and a light receiver over the carrier; forming a first light guide structure over the light source; and coupling a second light guide structure to the first light guide structure, where a cavity is formed between the light receiver and the second light guide structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
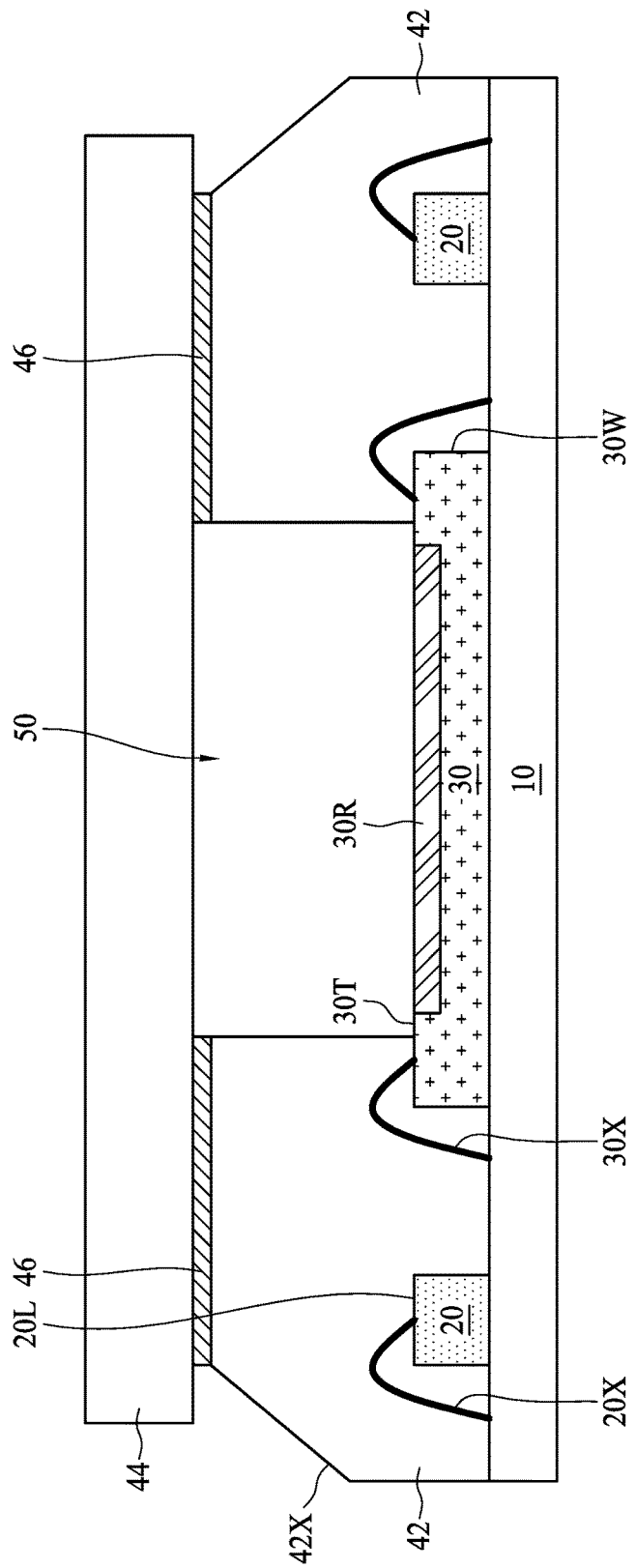
FIG. 1 is a schematic diagram of an example of an electronic device in accordance with a first embodiment of the present disclosure.

An optical sensor, such as a biosensor or a fingerprint recognition sensor, may suffer from low sensitivity contrast due to light loss during light transmission. One fabrication method uses injection molding to form a light guide structure, which is difficult to be shaped to form a micron-sized structure. In addition, the light guide structure formed by injection molding may not be able to contact a light source, which creates an air gap between the light guide structure and the light source, thereby generating light loss. Furthermore, the light guide structure formed by injection molding may not be resistant to high temperature during surface mount technology (SMT) processing, so the light guide structure is formed after high temperature SMT processing. Therefore, an additional tape is used to isolate a light receiver from contamination during SMT processing, which increases manufacturing stages and cost.

The present disclosure provides many different embodiments, or examples, for implementing different features of the provided subject matter. Specific examples of components and arrangements are described below for purposes of explanation, and are not to be construed as limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

The following description is directed to an electronic device. In some embodiments, the electronic device includes a light source, a light receiver, a first light guide structure around the light receiver, and a second light guide structure over the light receiver and coupled to the first light guide structure. The electronic device further includes a cavity between the light receiver and the second light guide structure. The following description is further directed to a package structure. In some embodiments, the package structure includes a carrier, a light receiver, a light guide structure encapsulating the light receiver, and the light guide structure defines a cavity recessed from a top surface of the light guide structure. The cavity is disposed over and aligned with the light receiver, and the light guide structure includes a lateral wall surrounding the cavity. The following description is also directed to a method of manufacturing an electronic device, as discussed below. The electronic device and the package structure are able to be configured as an optical device such as, but not limited to, an optical sensor including a biosensor or a fingerprint recognition sensor.

FIG. 1 is a schematic diagram of an example of an electronic device 1 in accordance with a first embodiment of the present disclosure. As shown in FIG. 1, the electronic device 1 includes at least one light source 20, a light receiver 30, a first light guide structure 42 and a second light guide structure 44. In one or more embodiments, the light source 20, the light receiver 30 and the first light guide structure 42 are disposed over a carrier 10. The carrier 10 may include a substrate such as a semiconductor substrate, a circuit board, or the like. In one or more embodiments, conductive wirings (not shown) are disposed over or are embedded in the carrier 10. The light source 20 is configured to emit light toward the first light guide structure 42. The light source 20 may include a light emitting diode (LED), or other suitable light sources able to emit light. In one or more embodiments, the light source 20 is electrically connected to the conductive wirings of the carrier 10 through bonding wires 20X. The light source 20 has a light emitting surface 20L facing the first light guide structure 42, and light is emitted from the light emitting surface 20L toward the first light guide structure 42.

The light receiver 30 is configured to sense light. In one or more embodiments, the light receiver 30 includes an optical sensor die, and a top surface 30T of the light receiver 30 includes a light receiving region 30R. An optical sensor array formed from complementary-metal-oxide-semiconductor (CMOS) sensors, charge-coupled device (CCD) sensors or other suitable sensors is disposed in the light receiving region 30R to sense light. In one or more embodiments, the light receiver 30 is electrically connected to the conductive wirings of the carrier 10 through bonding wires 30X.

The first light guide structure 42 is configured to guide light emitted from the light source 20 to the second light guide structure 44. The first light guide structure 42 has a first index of refraction. In one or more embodiments, the first light guide structure 42 is in contact with the light emitting surface 20L of the light source 20, so as to reduce light loss due to reflection. In one or more embodiments, the first light guide structure 42 is disposed around a periphery of the light receiver 30, facing and in contact with and covering a lateral wall 30W of the light receiver 30. In one or more embodiments, the first light guide structure 42 is in contact with and covers a peripheral portion of the top surface 30T of the light receiver 30, but exposes the light receiving region 30R. In one or more embodiments, the first light guide structure 42 encloses the bonding wires 30X so as to protect the bonding wires 30X. A material of the first light guide structure 42 includes a resin such as, but not limited to, epoxy or silicone. In one or more embodiments, the first light guide structure 42 includes an inclined sidewall 42X, inclined with respect to the light emitting surface 20L, and configured to increase internal reflection of light in the first light guide structure 42. For example, the inclined sidewall 42X may form an angle, with respect to the light emitting surface 20L, that is less than 90°, such as about 80° or smaller, about 60° or smaller, or about 45° or smaller.

The second light guide structure 44 is disposed over the light receiver 30 and coupled to the first light guide structure 42. The second light guide structure 44 has a third index of refraction, and a ratio of the third index of refraction to the first index of refraction is about 1. A material of the second light guide structure 44 may include a resin or a ceramic such as, but not limited to, epoxy, silicone or glass. In one or more embodiments, a cavity 50 is formed between the light receiver 30 and the second light guide structure 44, and surrounded by the first light guide structure 42. In one or more embodiments, the cavity 50 is hermetically sealed, and a medium is filled in the cavity 50. The medium in the cavity 50 has a second index of refraction, and a ratio of the first index of refraction to the second index of refraction is greater than 1, such as about 1.1 or greater, about 1.3 or greater, or about 1.5 or greater. By way of example, the medium is air, vacuum or other suitable media.

In one or more embodiments, an adhesive film 46 is disposed between and in contact with the first light guide structure 42 and the second light guide structure 44 to adhere the first light guide structure 42 and the second light guide structure 44. In one or more embodiments, the adhesive film 46 includes, or is formed from, an adhesive such as, but not limited to, a clear epoxy adhesive. The adhesive film 46 has a fourth index of refraction, and a ratio of the fourth index of refraction to the first index of refraction is about 1. In one or more embodiments, the first light guide structure 42 and the second light guide structure 44 may be coupled to each other in other suitable manners.

Figure 2A:
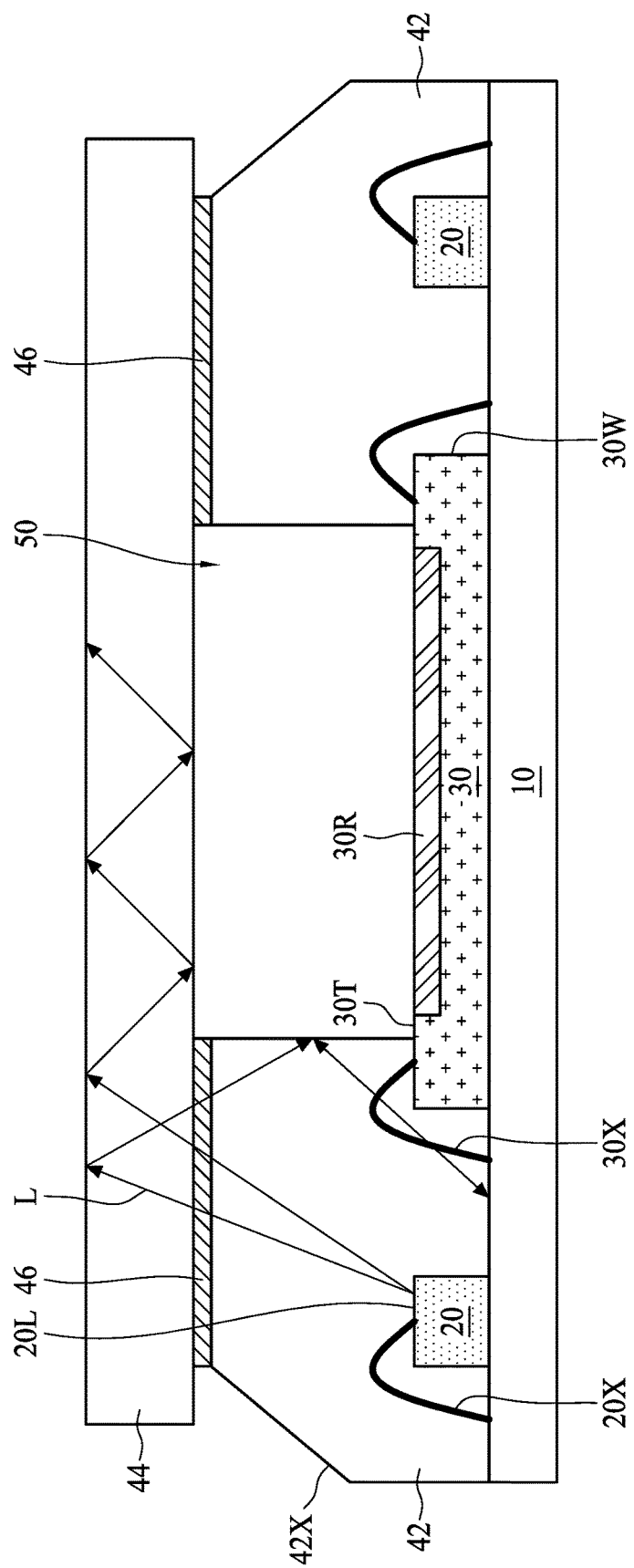
FIG. 2A is a schematic diagram illustrating a light path in an electronic device in accordance with a first embodiment of the present disclosure, when no object is placed on a second light guide structure.

FIG. 2A is a schematic diagram illustrating a light path in the electronic device 1 in accordance with the first embodiment when no object is placed on the second light guide structure 44. Referring to FIG. 2A, the first light guide structure 42, the adhesive film 46 and the second light guide structure 44 are transmissive to light L emitted from the light source 20. Since the first index of refraction of the first light guide structure 42, the third index of refraction of the second light guide structure 44 and the fourth index of refraction of the adhesive film 46 are substantially equal, the first light guide structure 42, the adhesive film 46 and the second light guide structure 44 can be regarded as a same transmissive medium and there will be little or no optical interface between the first light guide structure 42 and the adhesive film 46, and between the adhesive film 46 and the second light guide structure 44. Consequently, light loss when transmitted through the first light guide structure 42, the adhesive film 46 and the second light guide structure 44 due to reflection is minimized. Since the ratio of the first index of refraction of the first light guide structure 42 to the second index of refraction of the medium in the cavity 50 is greater than 1, internal reflection will occur in the first light guide structure 42, the adhesive film 46 and the second light guide structure 44, and most of light L will not be incident on the light receiving region 30R. Thus, light crosstalk can be alleviated.

Figure 2B:
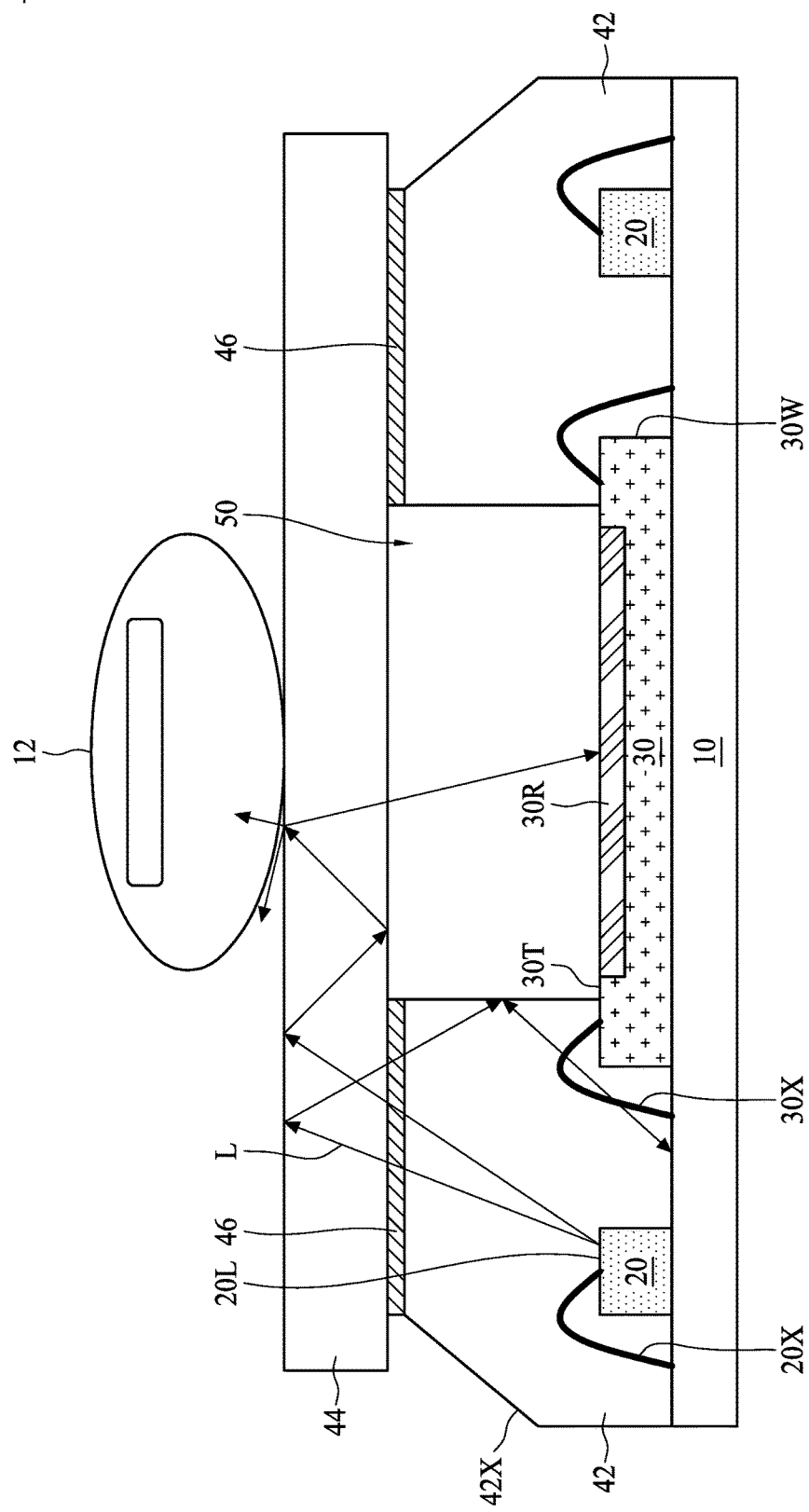
FIG. 2B is a schematic diagram illustrating a light path in an electronic device in accordance with a first embodiment of the present disclosure, when an object is placed on a second light guide structure.

FIG. 2B is a schematic diagram illustrating a light path in the electronic device 1 in accordance with the first embodiment when an object is placed on the second light guide structure 44. Referring to FIG. 2B, when an object 12 such as, but not limited to, a finger or a stylus is placed on the second light guide structure 44, some light L will be reflected towards the light receiving region 30R, some light L will be scattered, and some light L will be absorbed by the object 12. Accordingly, an intensity distribution of the light L is captured by the light receiver 30, and a touch input can be recognized. By virtue of the first light guide structure 42 and the second light guide structure 44, some of the light L can reach a center portion of the light receiving region 30R, thereby improving the recognition in the center portion of the light receiving region 30R.

FIG. 3A, FIG. 3B, FIG. 3C and FIG. 3D illustrate an example of a manufacturing method of the electronic device in 1 accordance with the first embodiment of the present disclosure.

Figure 3A:
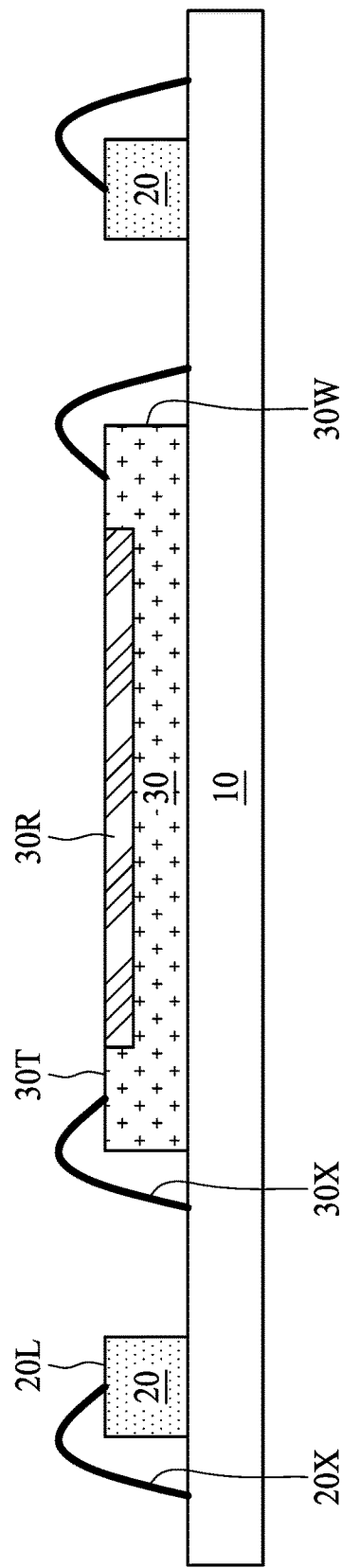
FIG. 3A, FIG. 3B, FIG. 3C and FIG. 3D illustrate an example of a manufacturing method of an electronic device in accordance with a first embodiment of the present disclosure.

Referring to FIG. 3A, a carrier 10 is provided. The carrier 10 may include a substrate such as a semiconductor substrate, a circuit board, or the like. In one or more embodiments, conductive wirings (not shown) are disposed over or are embedded in the carrier 10. At least one light source 20 and a light receiver 30 are disposed over the carrier 10. In one or more embodiments, the light source 20 is electrically connected to the conductive wirings of the carrier 10 through bonding wires 20X. In one or more embodiments, the light receiver 30 is electrically connected to the conductive wirings of the carrier 10 through bonding wires 30X.

Figure 3B:
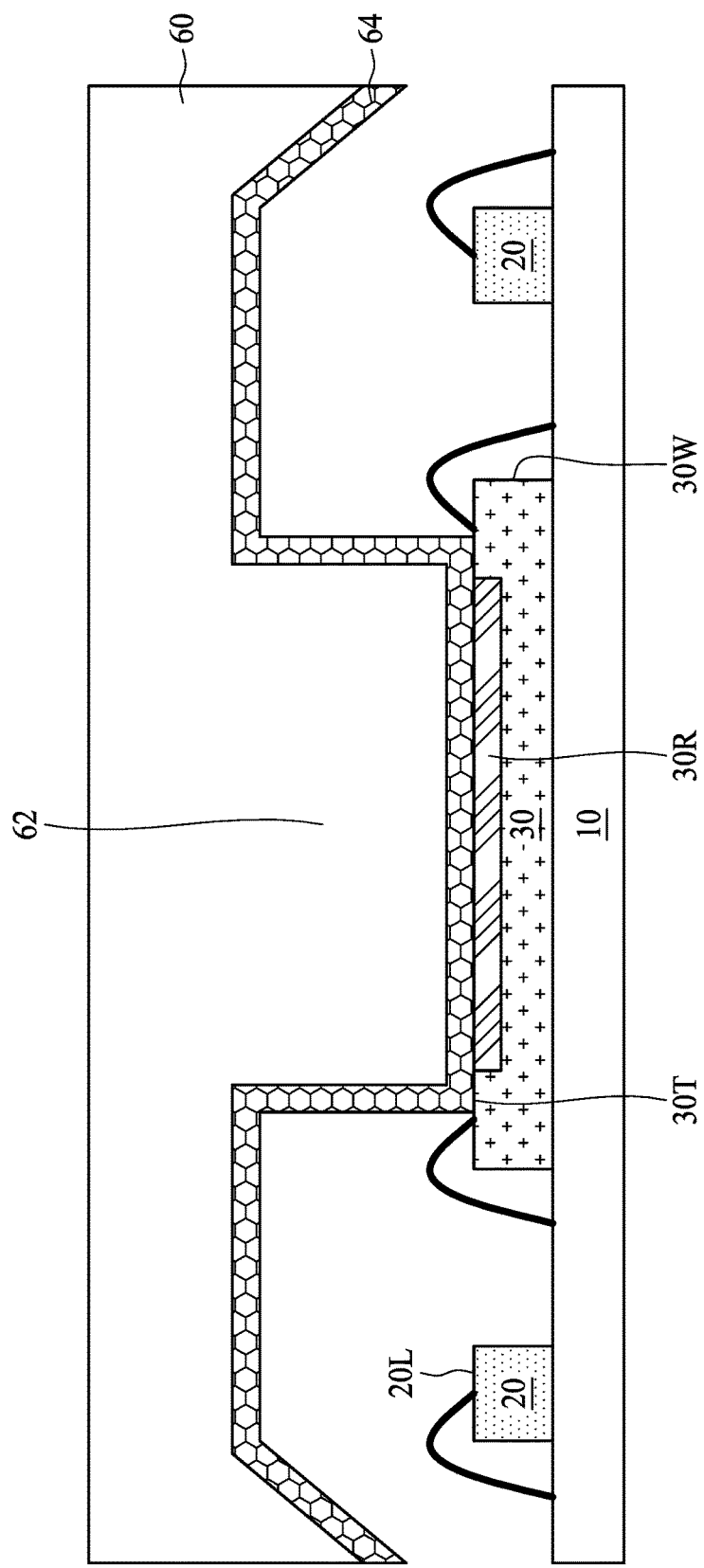
Figure 3C:
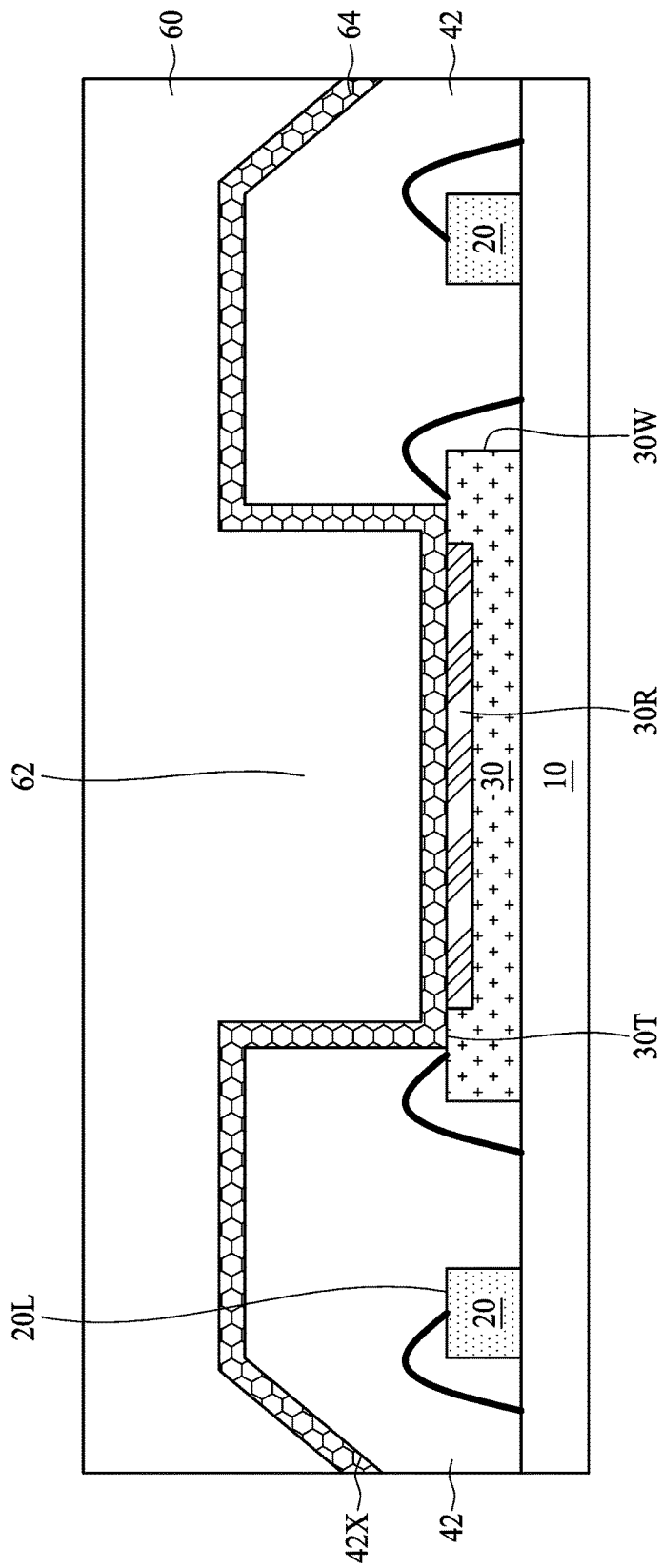

Referring to FIG. 3B and FIG. 3C, a first light guide structure 42 is formed on the light source 20 subsequent to the light receiver 30 being disposed over the carrier 10. In one or more embodiments, the first light guide structure 42 is formed on the light source 20 by a molding technique. As depicted in FIG. 3B, a mold chase 60 including a protrusion 62 is provided. In one or more embodiments, a film 64 is formed on, or applied to, the protrusion 62 or on an entirety of a surface of the mold chase 60. The mold chase 60 with the film 64 is then placed over the carrier 10 and the light source 20, and in contact with a portion of a top surface 30T of the light receiver 30. The film 64 is made of a flexible material which can provide a cushion effect, and thus the light receiver 30 is not damaged by the mold chase 60 during molding. As depicted in FIG. 3C, a molding material is filled into a space between the mold chase 60 and the carrier 10 to form the first light guide structure 42. The molding material is in a liquid form when applied, and is then solidified, such as by thermally and/or optically curing, to form the first light guide structure 42. By way of example, the material of the first light guide structure 42 includes a resin such as, but not limited to, epoxy or silicone. In one or more embodiments, the first light guide structure 42 encapsulates the light source 20 and a portion of the light receiver 30. In one or more embodiments, the first light guide structure 42 encapsulates and protects the bonding wires 20X and the bonding wires 30X.

Figure 3D:
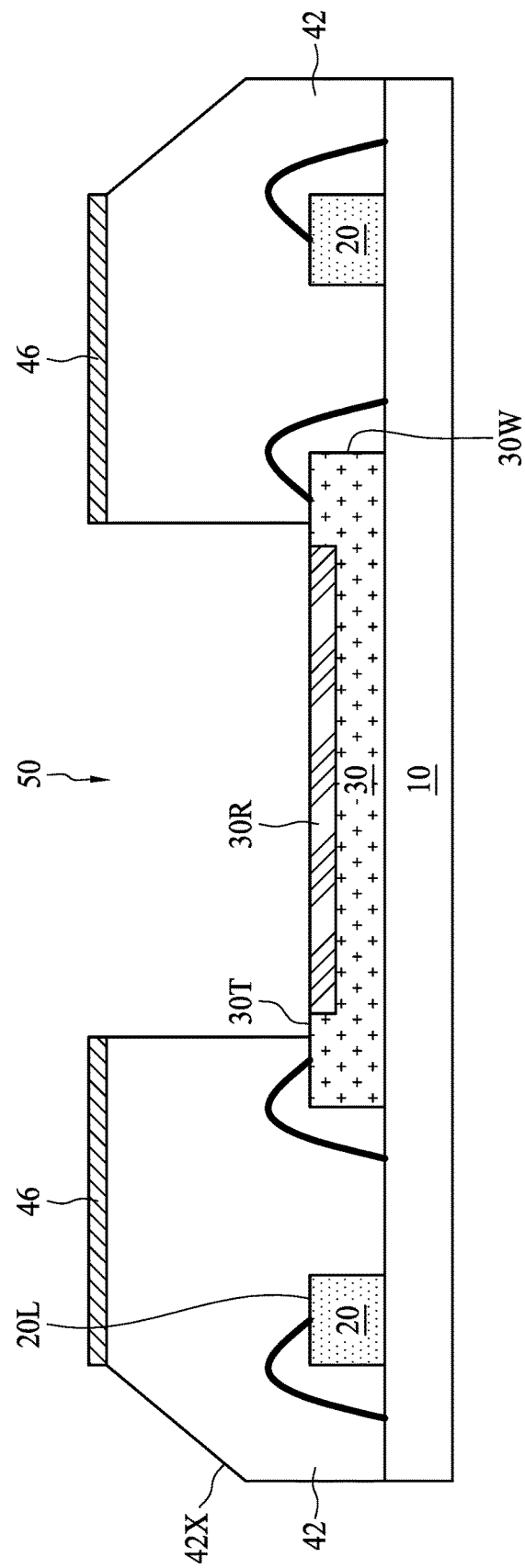

Referring to FIG. 3D, the mold chase 60 and the film 64 are removed from the first light guide structure 42, forming a cavity 50 surrounded by the first light guide structure 42. Subsequently, a second light guide structure 44 is coupled with the first light guide structure 42, and the cavity 50 is located between the light receiver 30 and the second light guide structure 44. A material of the second light guide structure 44 may include a resin or a ceramic such as, but not limited to, epoxy, silicone or glass. Accordingly, the electronic device 1 as depicted in FIG. 1 is formed. In one or more embodiments, the second light guide structure 44 is coupled to the first light guide structure 42 with an adhesive film 46. In one or more embodiments, the adhesive film 46 includes, or is formed from, an adhesive such as, but not limited to, a clear epoxy adhesive.

Figure 4:
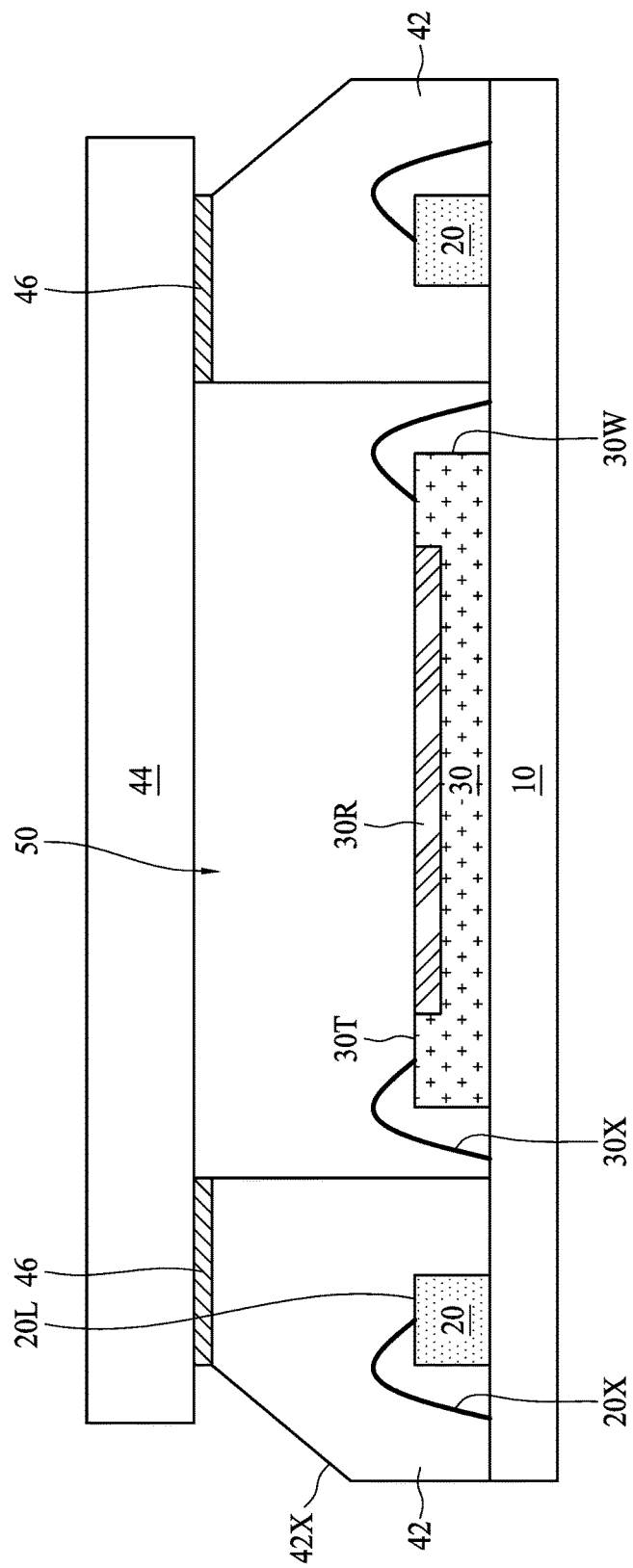
FIG. 4 is a schematic diagram of an example of an electronic device in accordance with a second embodiment of the present disclosure.

FIG. 4 is a schematic diagram of an example of an electronic device 2 in accordance with a second embodiment of the present disclosure. As shown in FIG. 4, different from the electronic device 1 of the first embodiment, a first light guide structure 42 of the electronic device 2 encapsulates the light source 20, but does not cover and exposes a top surface 30T and a light receiving region 30R of a light receiver 30.

FIG. 5A, FIG. 5B, FIG. 5C, FIG. 5D and FIG. 5E illustrate an example of a manufacturing method of the electronic device 2 in accordance with the second embodiment of the present disclosure.

Figure 5A:
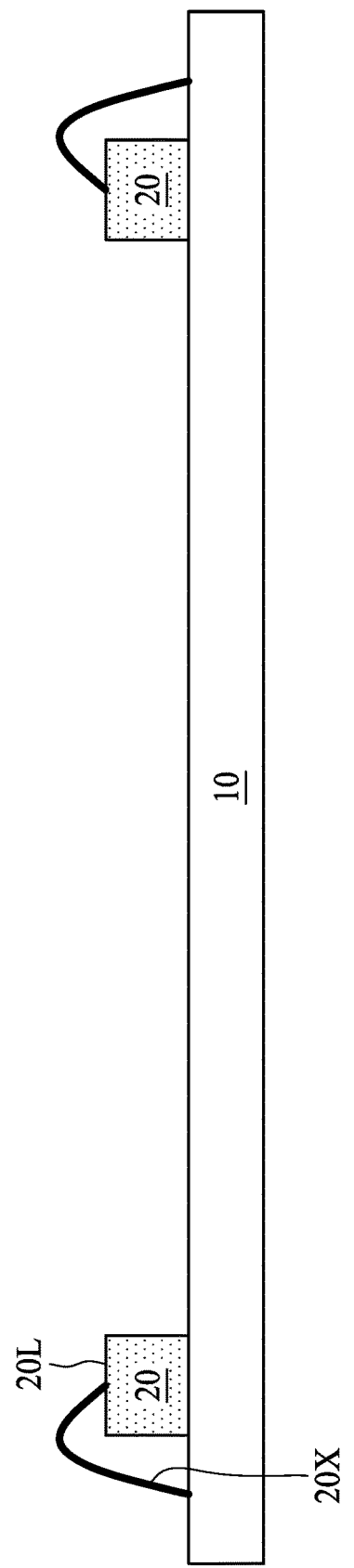
FIG. 5A, FIG. 5B, FIG. 5C, FIG. 5D and FIG. 5E illustrate an example of a manufacturing method of an electronic device in accordance with a second embodiment of the present disclosure.

Referring to FIG. 5A, a carrier 10 is provided. At least one light source 20 is disposed over the carrier 10. In one or more embodiments, the light source 20 is electrically connected to conductive wirings of the carrier 10 through bonding wires 20X.

Figure 5B:
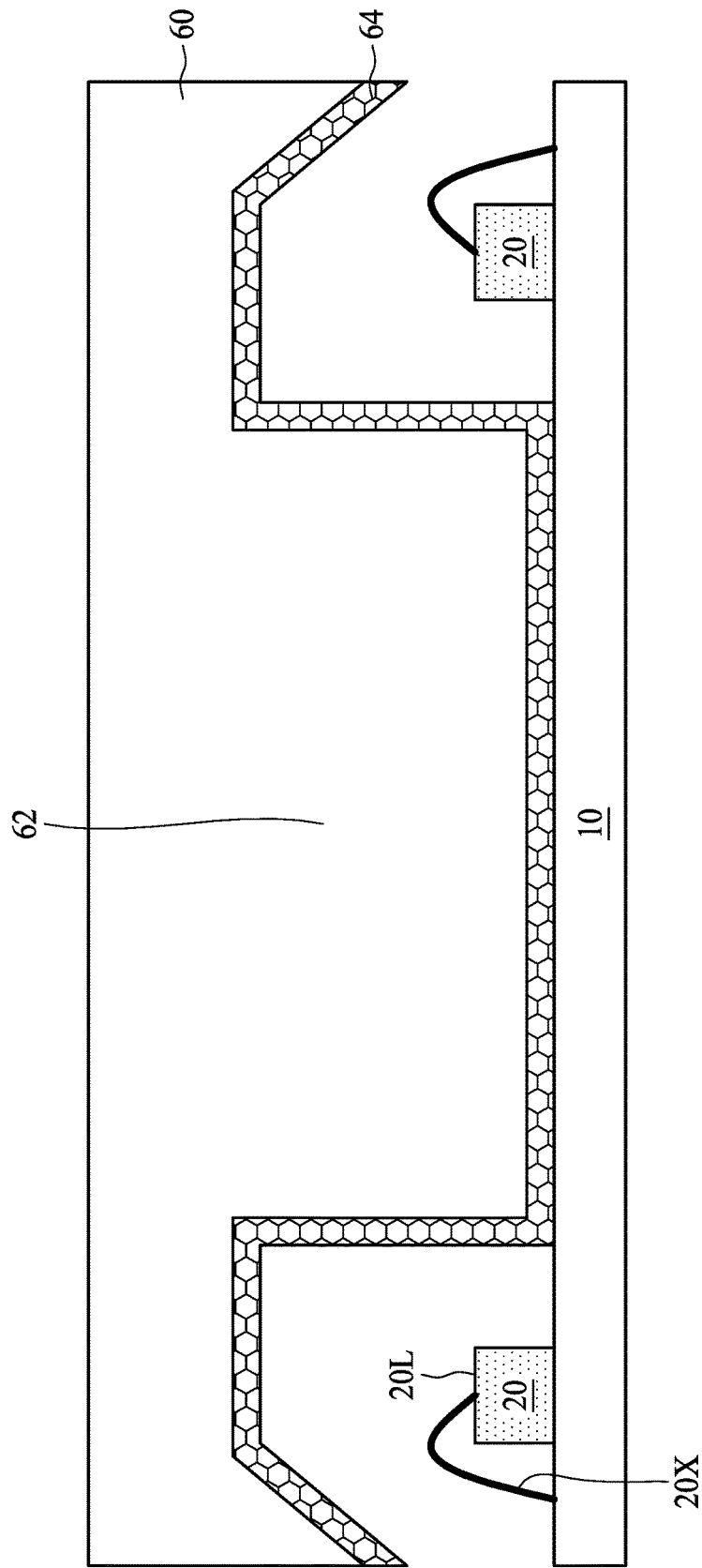

Referring to FIG. 5B, a mold chase 60 including a protrusion 62 is provided. In one or more embodiments, a film 64 is formed on, or applied to, the protrusion 62 or on an entirety of a surface of the mold chase 60. The mold chase 60 with the film 64 is then placed over the carrier 10 and the light source 20.

Figure 5C:
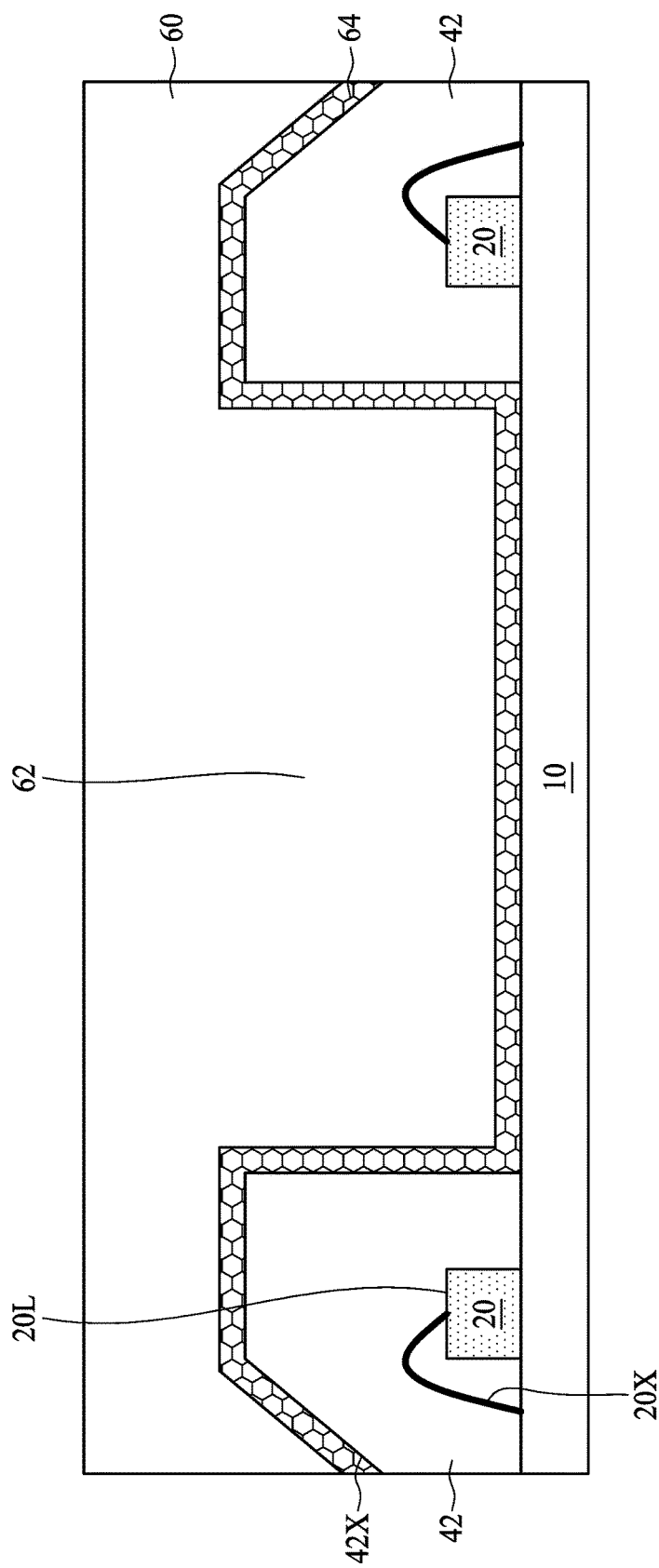

Referring to FIG. 5C, a molding material is filled into a space between the mold chase 60 and the carrier 10 to form a first light guide structure 42. The molding material is in a liquid form when applied, and is then solidified to form the first light guide structure 42. By way of example, the material of the first light guide structure 42 includes a resin such as, but not limited to, epoxy or silicone. In one or more embodiments, the first light guide structure 42 encapsulates the light source 20 and covers a portion of the carrier 10.

Figure 5D:
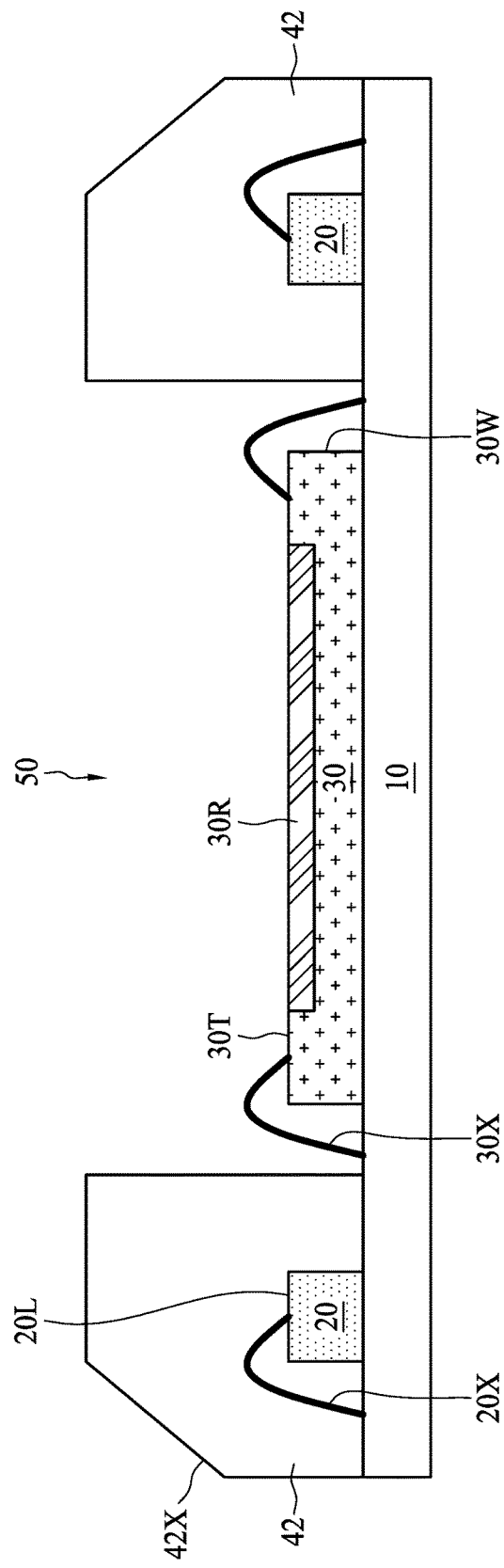

Referring to FIG. 5D, the mold chase 60 and the film 64 are removed from the first light guide structure 42, thereby forming a cavity 50 surrounded by the first light guide structure 42. Subsequently, a light receiver 30 is disposed over the carrier 10. In one or more embodiments, the light receiver 30 includes an optical sensor die, and a top surface 30T of the light receiver 30 includes a light receiving region 30R, and an optical sensor array formed from CMOS sensors, CCD sensors or other suitable sensors is disposed in the light receiving region 30R to sense light. In one or more embodiments, the light receiver 30 is electrically connected to the conductive wirings of the carrier 10 through bonding wires 30X. The light receiver 30 is disposed over the carrier 10 subsequent to formation of the first light guide structure 42, and thus is not damaged during molding of the first light guide structure 42.

Figure 5E:
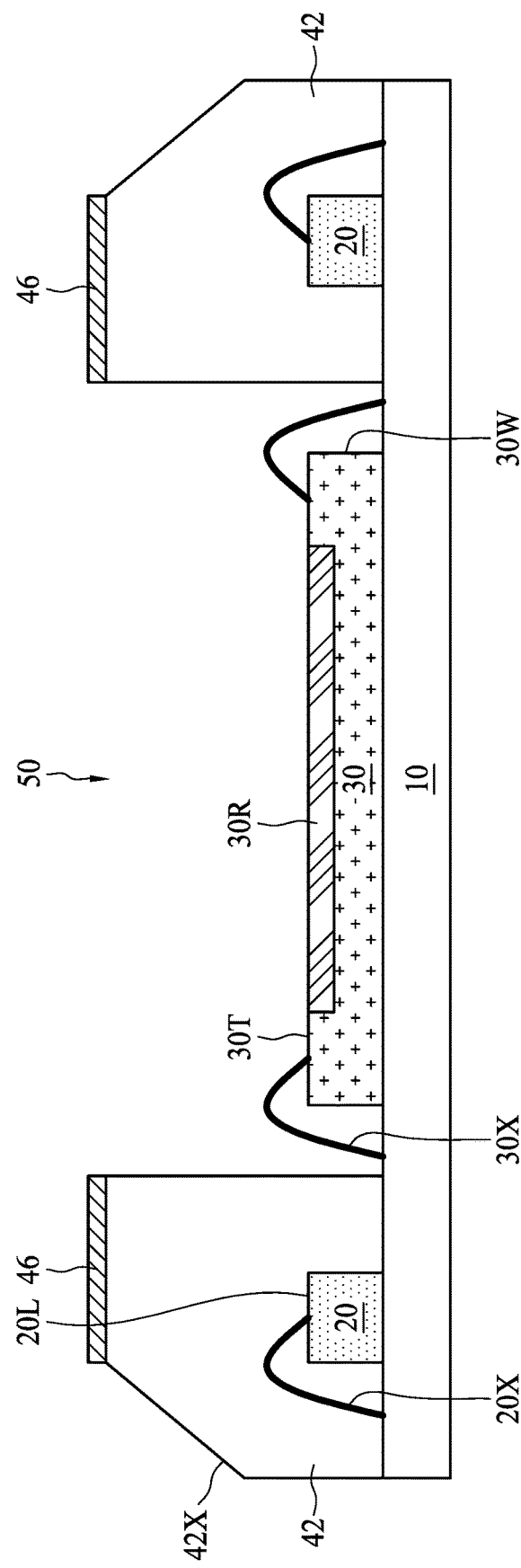

Referring to FIG. 5E, an adhesive film 46 is formed on the first light guide structure 42. In one or more embodiments, the adhesive film 46 includes, or is formed from, an adhesive such as, but not limited to, a clear epoxy adhesive. Subsequently, a second light guide structure 44 is coupled with the first light guide structure 42 by the adhesive film 46, and the cavity 50 is located between the light receiver 30 and the second light guide structure 44. A material of the second light guide structure 44 may include a resin or a ceramic such as, but not limited to, epoxy, silicone or glass. Accordingly, the electronic device 2 as depicted in FIG. 4 is formed.

Figure 6:
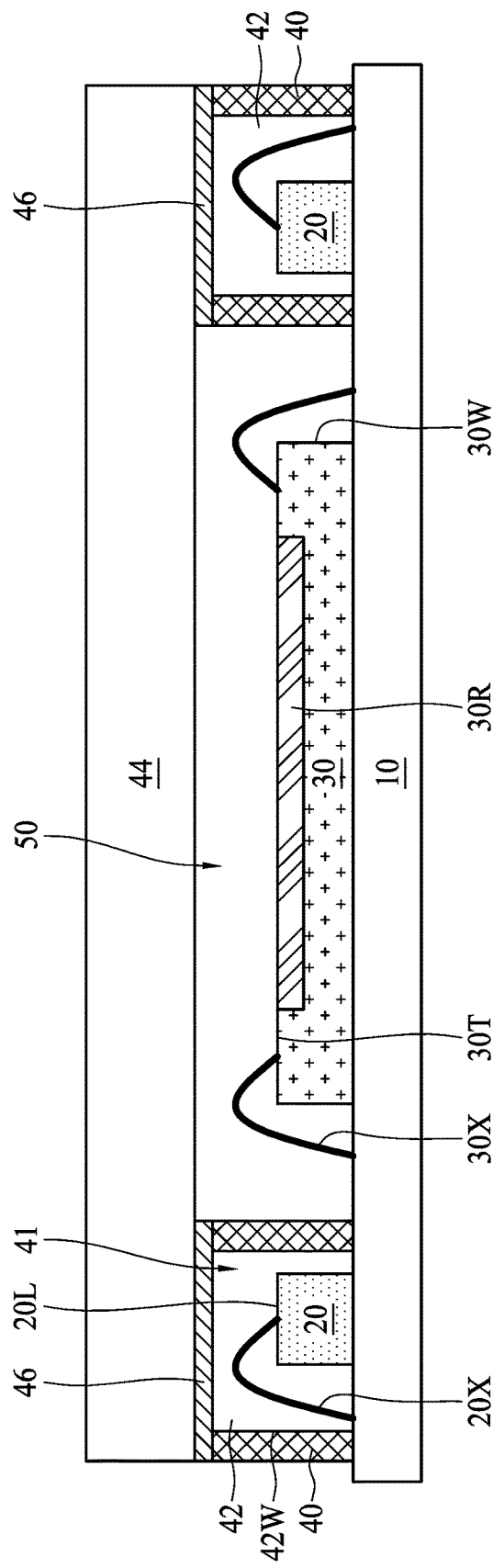
FIG. 6 is a schematic diagram of an example of an electronic device in accordance with a third embodiment of the present disclosure.

FIG. 6 is a schematic diagram of an example of an electronic device 3 in accordance with a third embodiment of the present disclosure. As shown in FIG. 6, different from the electronic devices 1, 2 of the aforementioned embodiments, the electronic device 3 further includes a partition structure 40 enclosing a lateral wall 42W of a first light guide structure 42.

FIG. 7A, FIG. 7B, FIG. 7C and FIG. 7D illustrate an example of a manufacturing method of the electronic device in 3 accordance with the third embodiment of the present disclosure.

Figure 7A:
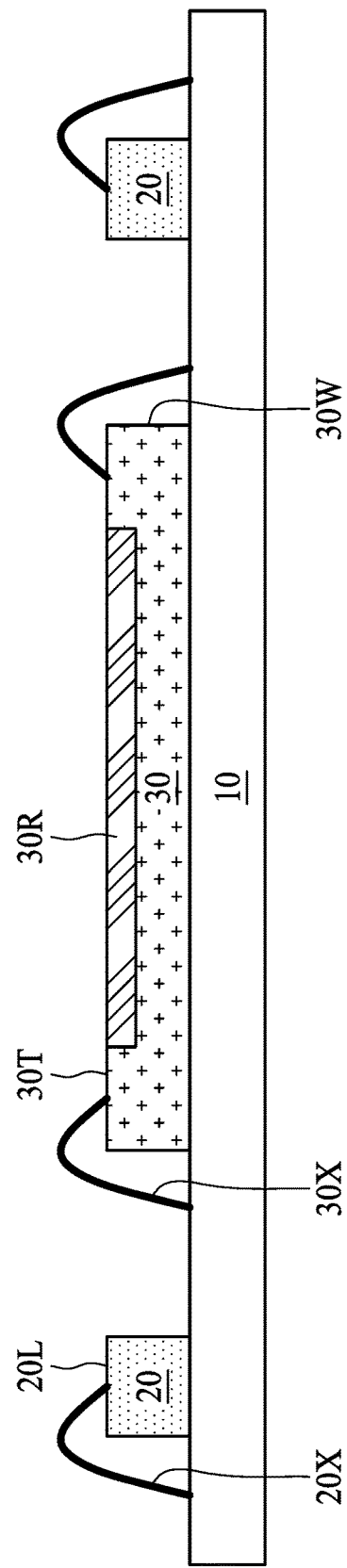
FIG. 7A, FIG. 7B, FIG. 7C and FIG. 7D illustrate an example of a manufacturing method of an electronic device in accordance with a third embodiment of the present disclosure.

Referring to FIG. 7A, a carrier 10 is provided. The carrier 10 may include a substrate such as a semiconductor substrate, a circuit board, or the like. In one or more embodiments, conductive wirings (not shown) are disposed over or are embedded in the carrier 10. At least one light source 20 and a light receiver 30 are disposed over the carrier 10. In one or more embodiments, the light source 20 is electrically connected to the conductive wirings of the carrier 10 through bonding wires 20X. In one or more embodiments, the light receiver 30 is electrically connected to the conductive wirings of the carrier 10 through bonding wires 30X.

Figure 7B:
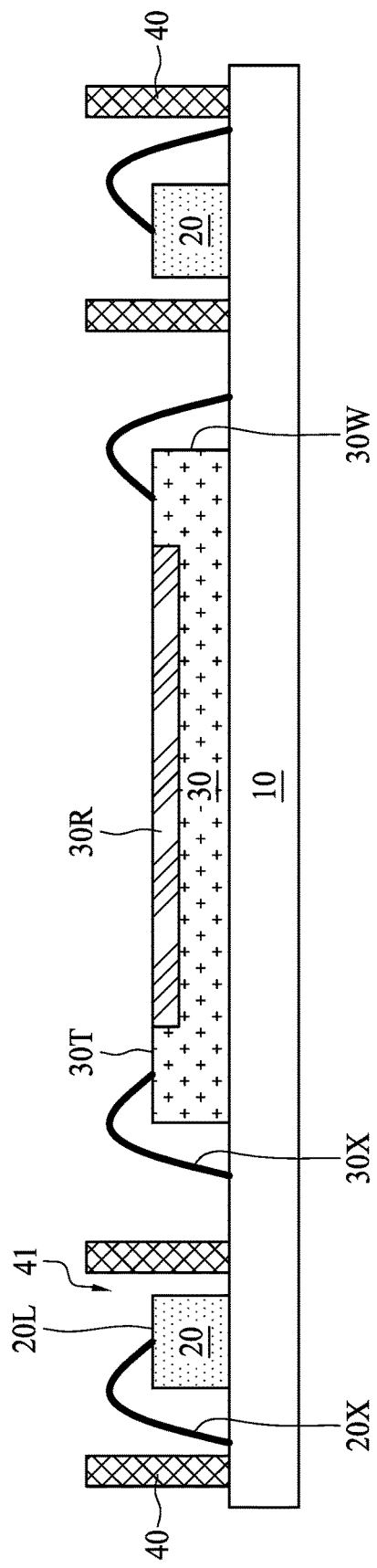

Referring to FIG. 7B, a partition structure 40 is formed over the carrier 10. In one or more embodiments, the partition structure 40 surrounds the light source 20, forming a dam 41 around the light source 20.

Figure 7C:
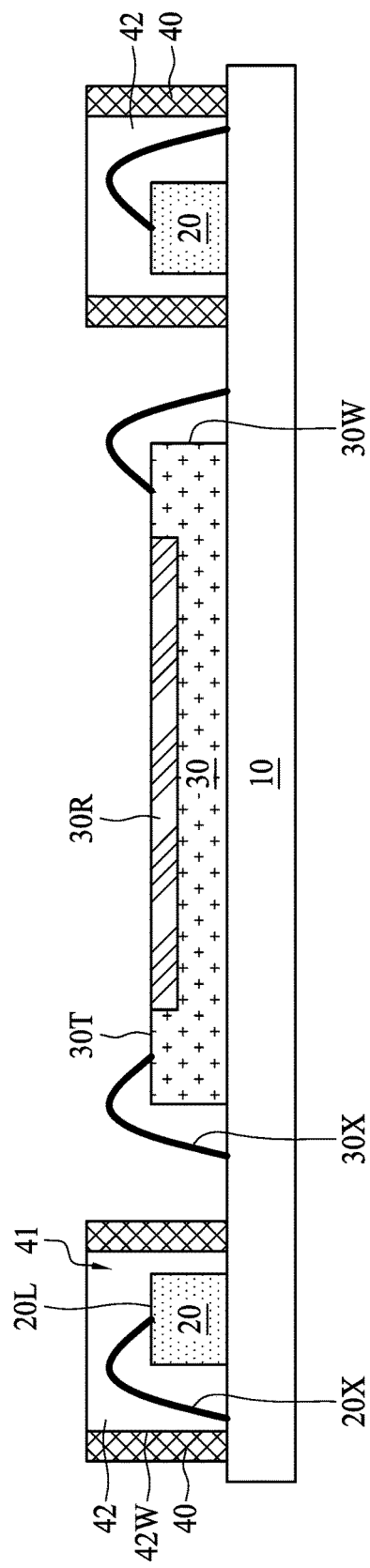

Referring to FIG. 7C, a fluid material is dispensed in the dam 41. The fluid material is then cured thermally and/or optically to form a first light guide structure 42. In one or more embodiments, the fluid material includes a resin such as, but not limited to, epoxy or silicone.

Figure 7D:
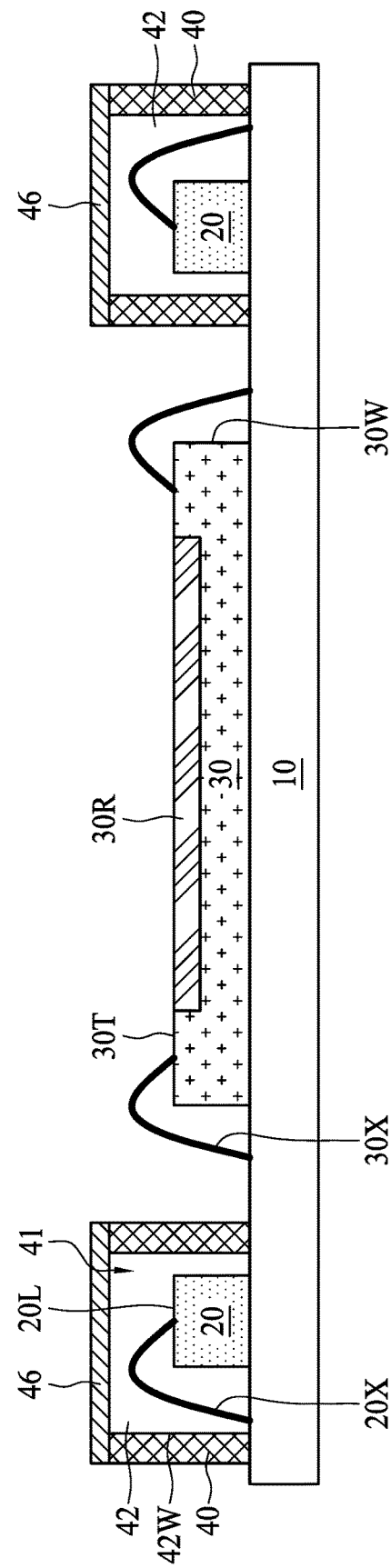

Referring to FIG. 7D, an adhesive film 46 is formed on the first light guide structure 42. In one or more embodiments, the adhesive film 46 includes, or is formed from, an adhesive such as, but not limited to, a clear epoxy adhesive. Subsequently, a second light guide structure 44 is coupled with the first light guide structure 42 by the adhesive film 46, forming a cavity 50 between the light receiver 30 and the second light guide structure 44. Accordingly, the electronic device 3 as depicted in FIG. 6 is formed. A material of the second light guide structure 44 may include a resin or a ceramic such as, but not limited to, epoxy, silicone or glass.

Figure 8:
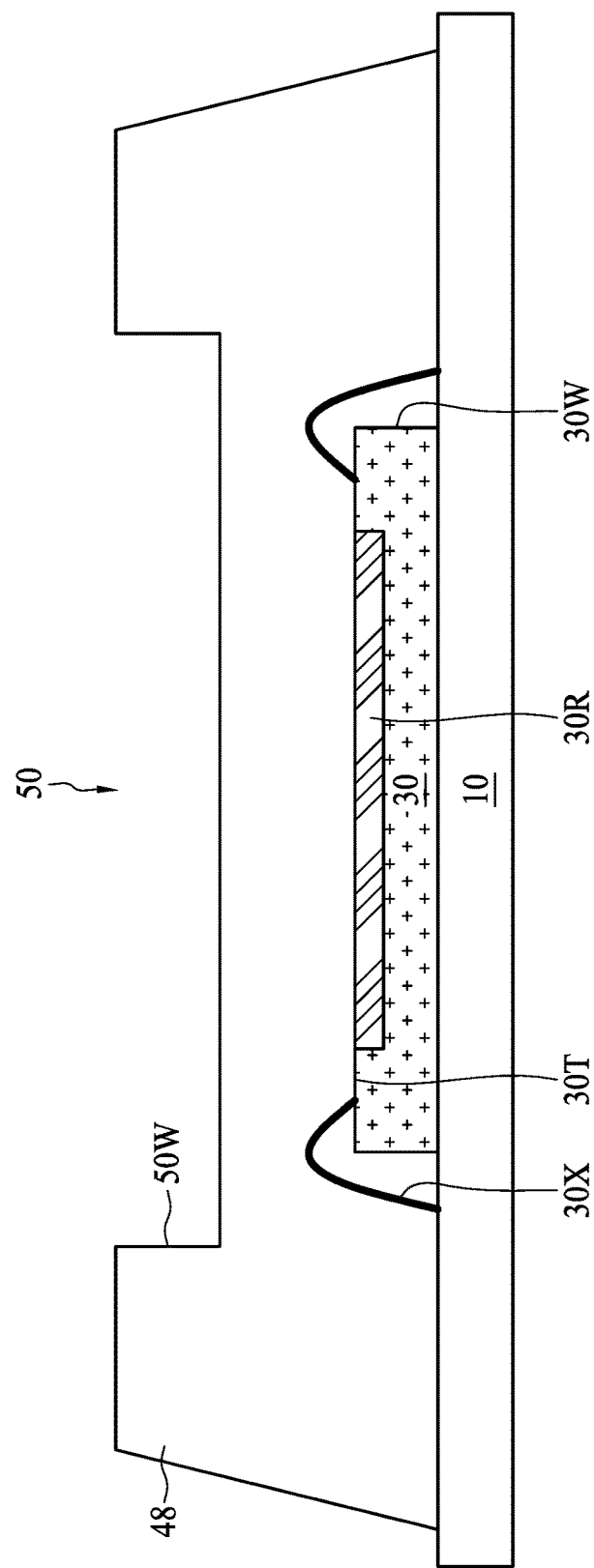
FIG. 8 is a schematic diagram of an example of a package structure in accordance with a fourth embodiment of the present disclosure.

FIG. 8 is a schematic diagram of an example of a package structure 4 in accordance with a fourth embodiment of the present disclosure. As shown in FIG. 8, the package structure 4 includes a carrier 10, a light receiver 30 disposed over the carrier 10, a light guide structure 48 encapsulating the light receiver 30, and a cavity 50 defined by the light guide structure 48 and recessed from a surface (e.g., a top surface) of the light guide structure 48. The cavity 50 is disposed over and aligned so as to correspond to the light receiver 30, and the light guide structure 48 includes a lateral wall 50W surrounding the cavity 50. A bottom of the cavity 50 is spaced from the light receiver 30 and is isolated from the light receiver 30 by a material of the light guide structure 48. In one or more embodiments, the material of the light guide structure 48 includes a resin such as, but not limited to, epoxy or silicone. In one or more embodiments, the light guide structure 48 is an integrally formed structure or a monolithic structure.

Figure 9:
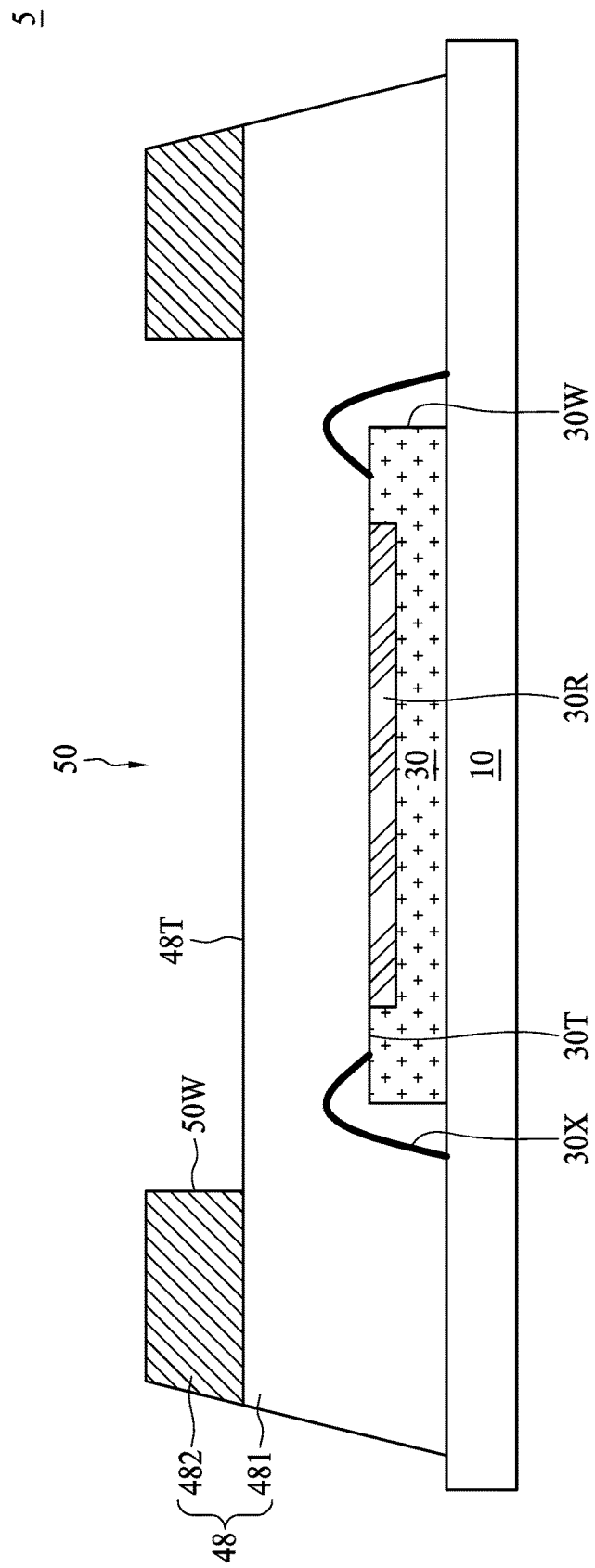
FIG. 9 is a schematic diagram of an example of a package structure in accordance with a fifth embodiment of the present disclosure.

FIG. 9 is a schematic diagram of an example of a package structure 5 in accordance with a fifth embodiment of the present disclosure. As shown in FIG. 9, different from the package structure 4 of the fourth embodiment, a light guide structure 48 of the package structure 5 includes a first portion 481 and a second portion 482 coupled to the first portion 481. The first portion 481 is disposed over the carrier 10 and encapsulates a light receiver 30. In one or more embodiments, the first portion 481 includes a top surface 48T, which is substantially even or planar without being recessed. The second portion 482 is coupled to a portion of the top surface 48T of the first portion 481. In one or more embodiments, the second portion 482 has a ring shape or a frame shape, defining a cavity 50 along with the first portion 481. In one or more embodiments, an index of refraction of the second portion 482 is substantially equal to that of the first portion 481. In one or more embodiments, a material of the first portion 481 may include a resin such as, but not limited to, epoxy or silicone, and a material of the second portion 482 may include an adhesive such as, but not limited to, a clear epoxy adhesive. In one or more embodiments, the first portion 481 may be formed by molding, and the second portion 482 may be dispensed, coated or printed on the top surface 48T of the first portion 481.

Figure 10:
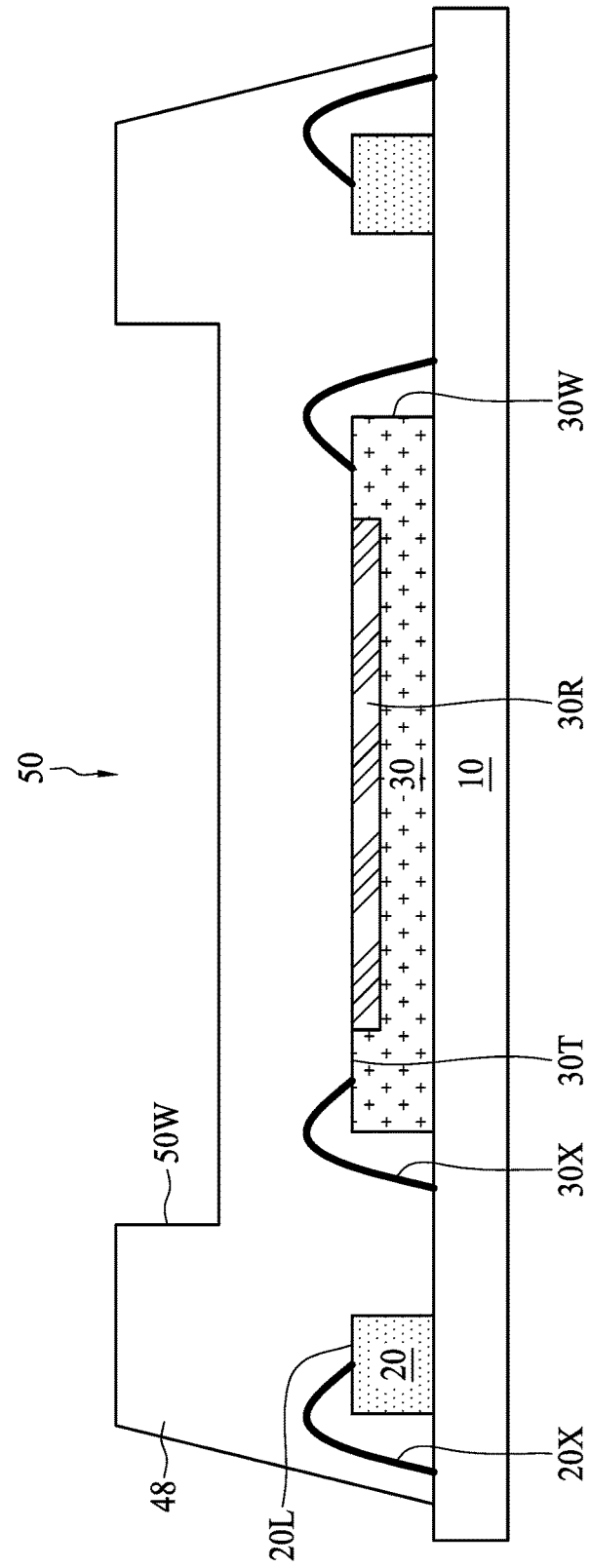
FIG. 10 is a schematic diagram of an example of a package structure in accordance with a sixth embodiment of the present disclosure.

FIG. 10 is a schematic diagram of an example of a package structure 6 in accordance with a sixth embodiment of the present disclosure. As shown in FIG. 10, different from the package structure 4 of the fourth embodiment, the package structure 6 of the sixth embodiment further includes at least one light source 20 disposed over a carrier 10. The light source 20 is encapsulated by a light guide structure 48. In one or more embodiments, the light guide structure 48 is in contact with a light emitting surface 20L of the light source 20. The light guide structure 48 is transmissive to light emitted from the light source 20.

Figure 11:
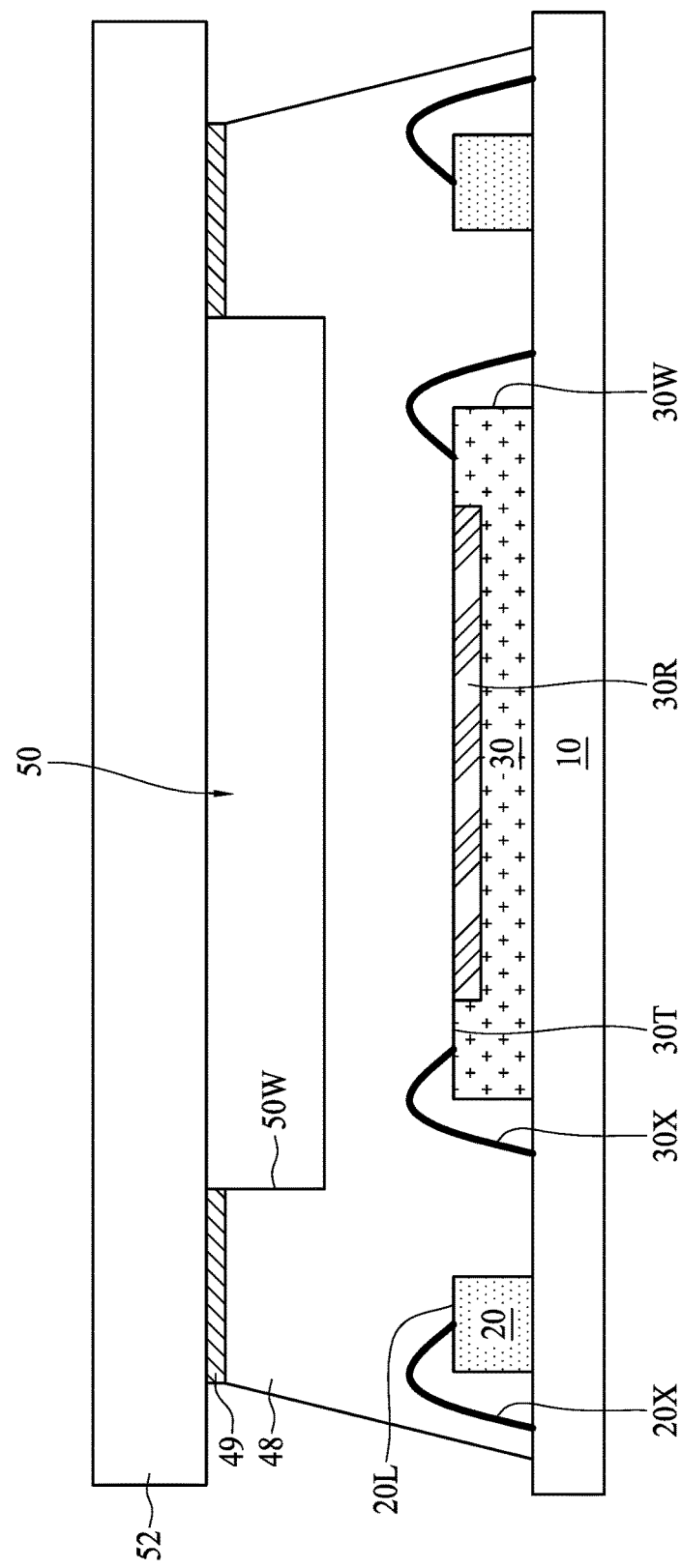
FIG. 11 is a schematic diagram of an example of a package structure in accordance with a seventh embodiment of the present disclosure.

FIG. 11 is a schematic diagram of an example of a package structure 7 in accordance with a seventh embodiment of the present disclosure. As shown in FIG. 11, different from the package structure 6 of the sixth embodiment, the package structure 7 of the seventh embodiment further includes a cover plate 52 disposed over a light receiver 30 and coupled to a light guide structure 48. In one or more embodiments, the cover plate 52 is attached to the light guide structure 48 with an adhesive film 49 including, or formed from, an adhesive such as, but not limited to, a clear epoxy adhesive. The cover plate 52 is transmissive to light emitted from a light source 20. In one or more embodiments, the cover plate 52 has an index of refraction substantially equal to that of the light guide structure 48. As such, the cover plate 52 is configured as a second light guide structure, and light emitted from the light source 20 is transmitted in the light guide structure 48 and the cover plate 52 due to internal reflection. In one or more embodiments, a cavity 50 is enclosed by the light guide structure 48 and the cover plate 52, and hermetically sealed. In one or more embodiments, the indices of refraction of the light guide structure 48 and the cover plate 52 are greater than that of a medium in the cavity 50. By way of example, a material of the light guide structure 48 includes a resin such as epoxy or silicone, a material of the cover plate 52 includes a resin or a ceramic such as epoxy, silicone or glass, and the medium includes air or vacuum.

Figure 12:
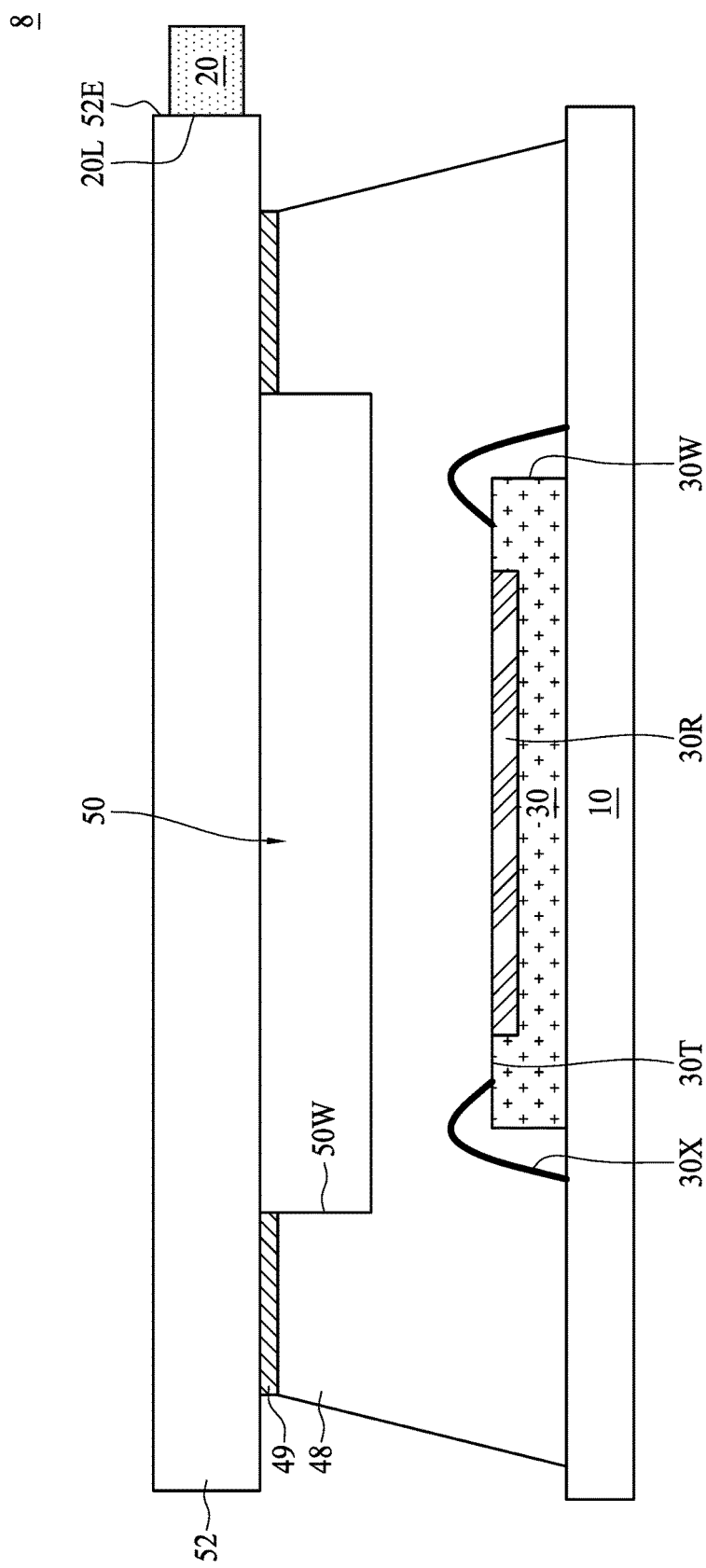
FIG. 12 is a schematic diagram of an example of a package structure in accordance with an eighth embodiment of the present disclosure.

FIG. 12 is a schematic diagram of an example of a package structure 8 in accordance with an eighth embodiment of the present disclosure. As shown in FIG. 12, different from the package structure 7 of the seventh embodiment, a light source 20 of the package structure 8 of the eight embodiment is facing an edge 52E of a cover plate 52 (e.g., a minor surface of the cover plate 52 instead of a major surface). In one or more embodiments, an index of refraction of the cover plate 52 is greater than that of a light guide structure 48 and is greater than that of a medium in a cavity 50. As such, the cover plate 52 is configured as a light guide structure, and light emitted from the light source 20 is transmitted in the cover plate 52 due to internal reflection.

Figure 13A:
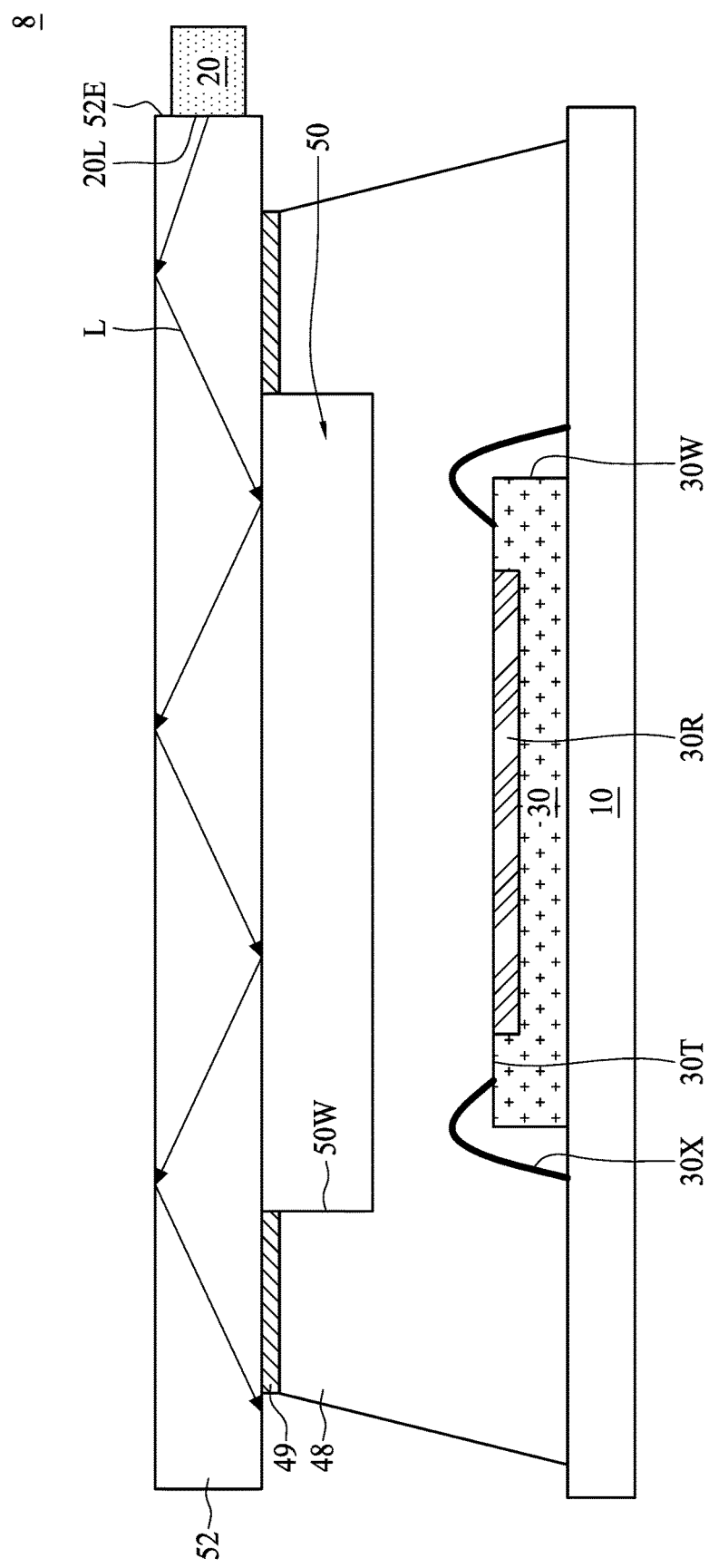
FIG. 13A is a schematic diagram illustrating a light path in a package structure in accordance with an eighth embodiment of the present disclosure, when no object is placed on a cover plate.

FIG. 13A is a schematic diagram illustrating a light path in the package structure 8 in accordance with the eighth embodiment when no object is placed on the cover plate 52. Referring to FIG. 13A, since the index of refraction of the cover plate 52 is greater than that of the light guide structure 48 and greater than that of the medium in the cavity 50, internal reflection will occur in the cover plate 52, and most of light L will not be incident on a light receiving region 30R.

Figure 13B:
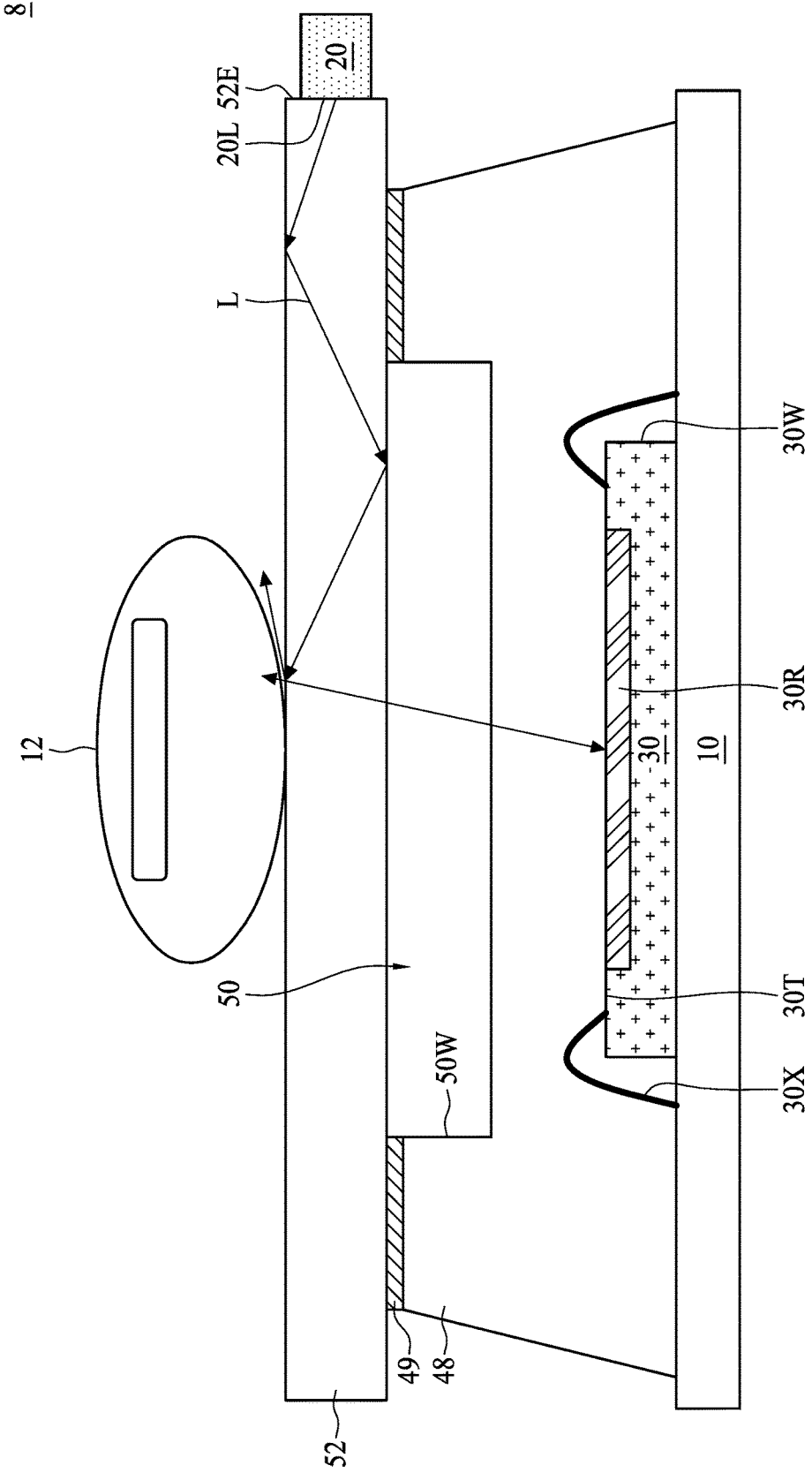
FIG. 13B is a schematic diagram illustrating a light path in a package structure in accordance with an eighth embodiment of the present disclosure, when an object is placed on a cover plate.

FIG. 13B is a schematic diagram illustrating a light path in the package structure 8 in accordance with the eighth embodiment when an object is placed on the cover plate 52. Referring to FIG. 13B, when an object 12 such as, but not limited to, a finger or a stylus is placed on the cover plate 52, some light L will be reflected towards the light receiving region 30R, some light L will be scattered, and some light L will be absorbed by the object 12. Accordingly, an intensity distribution of the light L is captured by the light receiver 30, and a touch input can be recognized. By virtue of the cover plate 52, some of the light L can reach a center portion of the light receiving region 30R, thereby improving the recognition in the center portion of the light receiving region 30R.

An electronic device or a package structure of some embodiments of the present disclosure includes a light guide structure covering a light emitting surface of a light source, and thus light loss is alleviated. The light guide structure has an index of refraction greater than that of a medium in a cavity over a light receiver. When no object is placed on the electronic device or the package structure, light can be transmitted inside the light guide structure due to internal reflection effect, thereby reducing light crosstalk. When an object is placed on the electronic device or the package structure, the internal reflection is altered, and light is reflected by the object toward a light receiver. As such, an intensity distribution of the light captured by the light receiver is relatively uniform, which increases recognition in a center portion of the light receiver. The light guide structure and a cover plate increase light usage, which can save power consumption of the light source. In addition, the light guide structure of the electronic device or the package structure is advantageous for its streamlined manufacturing process and reduced cost.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value and a second numerical value can be deemed to be "substantially" the same or equal if a ratio of the first value to the second value is within a range of variation of less than or equal to ±10% of 1, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a light source;
   a light receiver;
   a first light guide structure facing a light emitting surface of the light source and facing a lateral wall of the light receiver; and
   a second light guide structure over the light receiver and coupled to the first light guide structure,
   wherein the light receiver and the second light guide structure defines a cavity between the light receiver and the second light guide structure, the light receiver includes a top surface including a light receiving region, the light receiving region is exposed to the cavity, and the first light guide structure covers a portion of the top surface of the light receiver and exposes the light receiving region.

2. The electronic device of claim 1, further comprising a carrier, wherein the light source, the light receiver and the first light guide structure are disposed over the carrier.

3. The electronic device of claim 2, wherein the first light guide structure is in contact with the light emitting surface of the light source.

4. The electronic device of claim 1, wherein the first light guide structure has a first index of refraction, the cavity is filled with a medium having a second index of refraction, and a ratio of the first index of refraction to the second index of refraction is greater than 1.

5. The electronic device of claim 4, wherein the medium is air or vacuum.

6. The electronic device of claim 4, wherein the second light guide structure has a third index of refraction, and a ratio of the third index of refraction to the first index of refraction is about 1.

7. The electronic device of claim 6, further comprising an adhesive film disposed between and in contact with the first light guide structure and the second light guide structure, wherein the adhesive film has a fourth index of refraction, and a ratio of the fourth index of refraction to the first index of refraction is about 1.

8. The electronic device of claim 1, further comprising a partition structure enclosing a lateral wall of the first light guide structure.

9. A package structure, comprising:
   a carrier;
   a light receiver over the carrier; and
   a light guide structure encapsulating the light receiver,
   wherein the light guide structure defines a cavity recessed from a top surface of the light guide structure, the cavity is disposed over and aligned with the light receiver, the light guide structure includes a lateral wall surrounding the cavity, and the cavity is spaced from the light receiver by a portion of the light guide structure.

10. The package structure of claim 9, further comprising a light source over the carrier, wherein the light source includes a light emitting surface, and the light guide structure is in contact with the light emitting surface of the light source.

11. The package structure of claim 9, further comprising a cover plate coupled to the light guide structure and sealing the cavity, and a light source facing an edge of the cover plate.

12. The package structure of claim 9, wherein an index of refraction of the light guide structure is greater than an index of refraction of a medium in the cavity.

13. A method for manufacturing an electronic device, comprising:
   providing a carrier;
   disposing a light source and a light receiver over the carrier;
   forming a first light guide structure over the light source, wherein the first light guide structure is formed over the light source prior to disposing the light receiver over the carrier, and forming the first light guide structure over the light source comprises:
      providing a mold chase including a protrusion,
      placing the mold chase over the carrier with the protrusion facing the carrier,
      filling a molding material into a space between the mold chase and the carrier to form the first light guide structure encapsulating the light source, and
      removing the mold chase; and
   coupling a second light guide structure to the first light guide structure, wherein a cavity is formed between the light receiver and the second light guide structure.

14. The method of claim 13, further comprising:
   forming a partition structure over the carrier, wherein the partition structure defines a dam around the light source;
   dispensing a fluid material in the dam around the light source; and
   curing the fluid material to form the first light guide structure.

15. An electronic device, comprising:
   a light source;
   a light receiver;
   a first light guide structure facing a light emitting surface of the light source and facing a lateral wall of the light receiver;
   a partition structure enclosing a lateral wall of the first light guide structure; and
   a second light guide structure over the light receiver and coupled to the first light guide structure,
   wherein the light receiver and the second light guide structure defines a cavity between the light receiver and the second light guide structure.

16. The electronic device of claim 15, wherein the first light guide structure is in contact with the light emitting surface of the light source.

17. The electronic device of claim 15, wherein the first light guide structure has a first index of refraction, the cavity is filled with a medium having a second index of refraction, and a ratio of the first index of refraction to the second index of refraction is greater than 1.

18. The electronic device of claim 17, wherein the second light guide structure has a third index of refraction, and a ratio of the third index of refraction to the first index of refraction is about 1.

* * * * *